United States Patent
Tada et al.

(10) Patent No.: US 9,905,758 B2
(45) Date of Patent: Feb. 27, 2018

(54) SEMICONDUCTOR DEVICE AND METHOD FOR MANUFACTURING SAME

(71) Applicant: NEC CORPORATION, Japan (JP)

(72) Inventors: Munehiro Tada, Tokyo (JP); Toshitsugu Sakamoto, Tokyo (JP)

(73) Assignee: NEC CORPORATION, Minato-ku, Tokyo (JP)

(*) Notice: Subject to any disclaimer, the term of this patent is extended or adjusted under 35 U.S.C. 154(b) by 0 days.

(21) Appl. No.: 15/312,730

(22) PCT Filed: May 20, 2015

(86) PCT No.: PCT/JP2015/002538
§ 371 (c)(1),
(2) Date: Nov. 21, 2016

(87) PCT Pub. No.: WO2015/182074
PCT Pub. Date: Dec. 3, 2015

(65) Prior Publication Data
US 2017/0186947 A1    Jun. 29, 2017

(30) Foreign Application Priority Data
May 29, 2014 (JP) .................. 2014-111109

(51) Int. Cl.
*H01L 29/792* (2006.01)
*H01L 45/00* (2006.01)
*H01L 27/10* (2006.01)

(52) U.S. Cl.
CPC ........ *H01L 45/1233* (2013.01); *H01L 27/101* (2013.01); *H01L 45/1253* (2013.01); *H01L 45/1625* (2013.01); *H01L 45/1675* (2013.01)

(58) Field of Classification Search
CPC ............ G11C 13/0007; G11C 11/5685; G11C 11/5614; G11C 13/0011; G11C 14/0036;
(Continued)

(56) References Cited

U.S. PATENT DOCUMENTS

2010/0133501 A1*  6/2010  Sakamoto ......... G11C 13/0009
                                                           257/4
2010/0207093 A1    8/2010  Inoue et al.
(Continued)

FOREIGN PATENT DOCUMENTS

JP    2010-182849 A    8/2010
JP    2010-192605 A    9/2010
(Continued)

OTHER PUBLICATIONS

Munehiro Tada, et al., "Polymer Solid-Electrolyte Switch Embedded on CMOS for Nonvolatile Crossbar Switch", IEEE Transactions on Electron Devices, Dec. 2011, pp. 4398-4406, vol. 58, No. 12.
(Continued)

*Primary Examiner* — Sonya D McCall Shepard
(74) *Attorney, Agent, or Firm* — Sughrue Mion, PLLC

(57) ABSTRACT

The semiconductor device according to the present invention has an upper electrode, a first lower layer wiring that also functions as a lower electrode, an electrical resistance-changing film interposed between the upper electrode and the first lower layer wiring, a second lower layer wiring, and a contact plug, the contact plug connecting to the upper electrode and to the second lower layer wiring. The present invention yields a semiconductor device with which it is possible to dispose elements in high density while maintaining the reliability and manufacturing yield of the electrical resistance-changing element.

17 Claims, 14 Drawing Sheets

(58) Field of Classification Search
CPC ............ G11C 14/0081; G11C 11/5607; G11C 2211/5615–2211/5616; G11C 14/0045; G11C 14/009; G11C 13/0002; G11C 13/0004; H01L 45/145–45/147; H01L 27/222–27/228; H01L 43/00–43/14; H01L 29/82; H01L 2924/1443; H01L 45/04–45/065; H01L 45/14–45/1691; H01L 27/2427; H01L 2924/1438; H01F 41/303; H01F 10/324–10/3295; G01R 33/066

See application file for complete search history.

(56) References Cited

U.S. PATENT DOCUMENTS

| | | | |
|---|---|---|---|
| 2011/0272664 A1* | 11/2011 | Tada | ............... H01L 27/228 257/4 |
| 2013/0082231 A1 | 4/2013 | Tada et al. | |
| 2013/0224931 A1 | 8/2013 | Sorada et al. | |

FOREIGN PATENT DOCUMENTS

| | | |
|---|---|---|
| WO | 2011/158691 A1 | 12/2011 |
| WO | 2011/158821 A1 | 12/2011 |
| WO | 2012/127861 A1 | 9/2012 |
| WO | 2014/030393 A1 | 2/2014 |

OTHER PUBLICATIONS

International Search Report of PCT/JP2015/002538, dated Aug. 11, 2015. [PCT/ISA/210].

Written Opinion of PCT/JP2015/002538, dated Aug. 11, 2015. [PCT/ISA/237].

* cited by examiner

12 HARD MASK

14 SECOND INSULATION BARRIER FILM

16 INTERLAYER INSULATION FILM

15 INTERLAYER INSULATION FILM

SEMICONDUCTOR DEVICE AND METHOD FOR MANUFACTURING SAME

CROSS REFERENCE TO RELATED APPLICATIONS

This application is a National Stage of International Application No. PCT/JP2015/002538 filed May 20, 2015, claiming priority based on Japanese Patent Application No. 2014-111109 filed May 29, 2014, the contents of all of which are incorporated herein by reference in their entirety.

TECHNICAL FIELD

The present invention relates to a semiconductor device including a non-volatile resistance-changing element in a multilayered wiring layer formed on a semiconductor substrate and to a method for manufacturing the same.

BACKGROUND ART

Semiconductor devices which are semiconductor apparatuses, particularly silicon devices have undergone high integration and low electrical power consumption by miniaturization at a rate of quadrupling every three years according to a scaling law called Moore's law. In recent years, the gate length of MOSFETs (Metal Oxide Semiconductor Field Effect Transistors) has shrunk down to 20 nm or less. As a result, elevated prices of lithography processes, i.e., those of lithography apparatuses and mask sets, and physical limits owing to the dimension of the devices, i.e., the operation limit and variation limit thereof have made impossible the scaling at the existing rate. Accordingly, device performance is required to be improved by an approach different from the scaling law.

In recent years, using back-end devices has been expected to be an improvement method independent of the scaling law. The back-end devices are semiconductor devices including an element provided in a multilayered wiring layer of a semiconductor apparatus, such as an element which changes its resistance in a non-volatile fashion. Examples of the non-volatile resistance-changing element include a resistance-changing element used for MRAMs (Magneto-resistive Random Access Memories), PRAMs (Phase-change Random Access Memories), ReRAMs (Resistance Random Access Memories), and so on.

When used as memories or switches provided in a multilayered wiring layer of CMOS (Complementary Metal Oxide Semiconductor) semiconductor devices, these resistance-changing elements are expected to lower the power consumption of semiconductor devices. Further, these resistance-changing elements are expected to increase mounting capacity in association with the trend of the miniaturization of semiconductor devices and increase in data storage capacity.

On the other hands, in recent years, a rewritable programmable logic device called FPGA (Field-Programmable Gate Array) has been developed, which is regarded as an intermediate device between the gate-array and the standard cell. The FPGA enables customers themselves to switch the circuit architecture of the post-manufactured chip. The resistance-changing element provided in a multilayered wiring layer is expected to perform such switching of the circuit architecture. The reason is that the FPGA configured by using a resistance-changing element allows lowering power consumption, while improving the degree of freedom of the circuit architecture.

Examples of the preferable resistance-changing element for the application to such switching of the circuit architecture in the FPGA include NanoBridge® exploiting an ion-conductor, which is one form of ReRAMs. The ion-conductor is a solid electrolyte in which ions can be freely moved by an applied field such as electric field.

PTL 1 and NPL 1 disclose switching elements (also referred to as solid electrolyte switches) exploiting filament formation by both metal ion transfer and an electro-chemical reaction in the ion-conductor. The switching elements disclosed in PTL 1 and NPL 1 have not only an ion-conducting layer but also a first electrode (activating electrode) and a second electrode (deactivating electrode) which are disposed opposite to each other across the ion-conducting layer. Among them, the first electrode plays a role of supplying metal ions to the ion-conducting layer. The second electrode does not supply metal ions to the ion-conducting layer.

The operation of the switching element will be explained briefly. Earthing the first electrode and applying a negative voltage to the second electrode generates metal ions from the metal of the first electrode, and the ions dissolve into the ion-conducting layer. Then, the metal ions in the ion-conducting layer segregate as metal into the ion-conducting layer, and the segregated metal forms a metal cross-linking (filament) which connects the first electrode and second electrode. The switch is put in ON-state by the electrical connection of the first electrode and the second electrode owing to the metal cross-linking.

On the other hands, earthing the first electrode and applying a positive voltage to the second electrode in ON-state cuts a portion of the metal cross-linking. Thus, the electrical connection of the first electrode to the second electrode is cut to put the switch in OFF-state. An electrical property, such as increase in the resistance across the first electrode and the second electrode and variation in the inter-electrode capacity, begins changing before the complete electrical disconnection, and eventually leads to the electrical disconnection. Putting the switch in ON-state from OFF-state may be carried out again by earthing the first electrode and applying a negative voltage to the second electrode.

Such a switching element is characterized in that its size and on-resistance are smaller than those of semiconductor switches such as MOSFETs. Accordingly, the switching element is thought to be promising for application to programmable logic devices such as FPGAs. Further, in this switching element, since the electrically connected state, i.e., ON-state or OFF-state of the element is kept as is even without applying voltage, it is also possible to apply the element to a non-volatile memory element.

For example, a memory cell is prepared which is an elementary unit including one selecting element such as transistor and one switching element, and a plurality of the memory cells are disposed both in one direction and in another direction perpendicular thereto. Such an arrangement enables selecting any memory cell among a plurality of the memory cells by using a word-line and a bit-line. Thus, a non-volatile memory can be actualized which enables sensing the electrically connected state of a switching element in a selected memory cell, to read information of either "1" or "0" from ON- or OFF-state of the switching element.

CITATION LIST

Patent Literature

[PTL 1] WO 2011/158691

Non Patent Literature

[NPL 1] M. Tada, K. Okamoto, T. Sakamoto, M. Miyamura, N. Banno, and H. Hada, "Polymer Solid-Electrolyte (PSE) Switch Embedded on CMOS for Nonvolatile Crossbar Switch", IEEE TRANSACTION ON ELECTRON DEVICES, Vol. 58, No. 12, pp. 4398-4405, (2011).

SUMMARY OF INVENTION

Technical Problem

Meanwhile, when the above-described resistance-changing element exploiting an ionic conductor is used as a memory or a switch, it is desired to be formed into a size as minute as possible so as to be disposed highly densely. On the other hand, the operation of the resistance-changing element requires, not only an ion-conducting layer, but also an electrode, a contact plug connecting the electrode, a wiring, and so on. When more minute elements are formed, a subject is encountered which is a difficulty in laying out the elements highly densely, owing to short or connection failure in each of the above-described portions, a damage caused by, for example, oxidation in manufacturing processes, and so on.

The present invention has been achieved in view of the above-mentioned problem, a purpose of which is to actualize a semiconductor device with which resistance-changing elements can be disposed highly densely while keeping the manufacturing yield and reliability of the resistance-changing elements.

Solution to Problem

A semiconductor device according to the present invention includes an upper electrode, a first lower-layer wiring also used as a lower electrode, a resistance-changing film interposed between the upper electrode and the first lower-layer wiring, a second lower-layer wiring, and a contact plug, wherein the contact plug connects to the upper electrode and the second lower-layer wiring.

A method for manufacturing a semiconductor device according to the present invention includes forming a first lower-layer wiring and a second lower-layer wiring on a first interlayer insulation film formed on a semiconductor substrate; forming a first insulation barrier film on the first lower-layer wiring, the second lower-layer wiring, and the first interlayer insulation film, the first insulation barrier film having an opening portion through which at least the first lower-layer wiring is exposed; forming, through the opening portion, a resistance-changing film and an upper electrode successively on at least the first lower-layer wiring; forming a second insulation barrier film on at least side surface of the upper electrode; forming a second interlayer insulation film on the second insulation barrier film; forming a via-hole through the second interlayer insulation film and the second insulation barrier film, to expose the upper electrode and the second lower-layer wiring at the bottom of the via-hole; and forming, in the via-hole, a contact plug connecting the upper electrode and the second lower-layer wiring.

Advantageous Effects of Invention

According to the present invention, a semiconductor device is actualized with which resistance-changing elements can be disposed highly densely while keeping the manufacturing yield and reliability of the resistance-changing elements.

DESCRIPTION OF EMBODIMENTS

Hereinafter, exemplary embodiments of the present invention will be specifically explained with reference to the drawings. Although technically preferable limitations are made in the exemplary embodiments described below in order to actualize the present invention, they do not limit the scope of the invention to the following.

First Exemplary Embodiment

Figure 1:
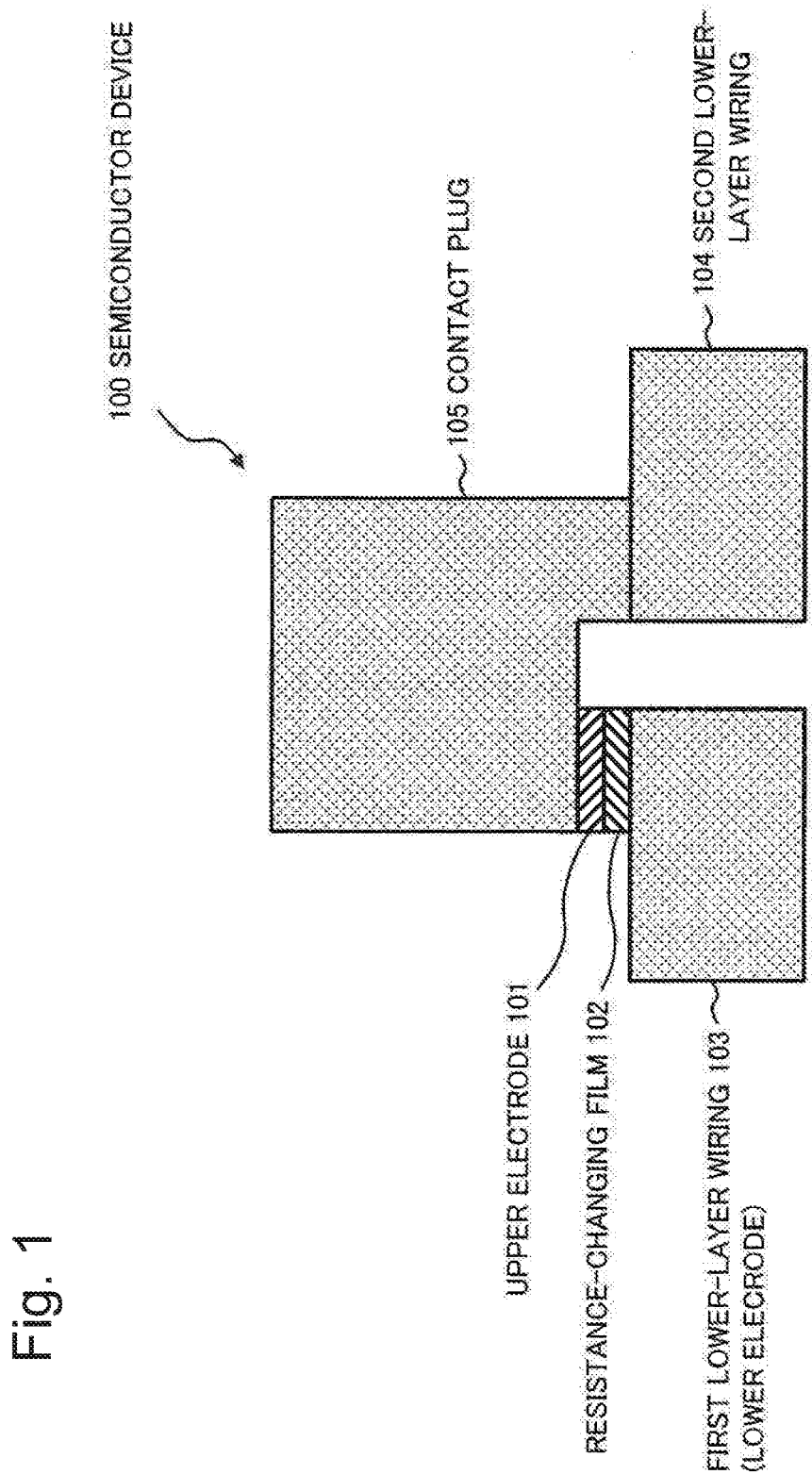
FIG. 1 is a cross-sectional schematic view illustrating a configuration of a semiconductor device of a first exemplary embodiment of the present invention.

FIG. 1 is a cross-sectional schematic view illustrating a configuration of a semiconductor device of a first exemplary embodiment of the present invention. A semiconductor device 100 of this exemplary embodiment has an upper electrode 101, a first lower-layer wiring 103 also used as a lower electrode, a resistance-changing film 102 interposed between the upper electrode 101 and the first lower-layer wiring 103, a second lower-layer wiring 104, and a contact plug 105. The contact plug 105 connects the upper electrode 101 and the second lower-layer wiring 104.

According to this exemplary embodiment, a semiconductor device is actualized with which resistance-changing elements can be disposed highly densely while keeping the manufacturing yield and reliability of the resistance-changing elements.

Second Exemplary Embodiment

Figure 2:
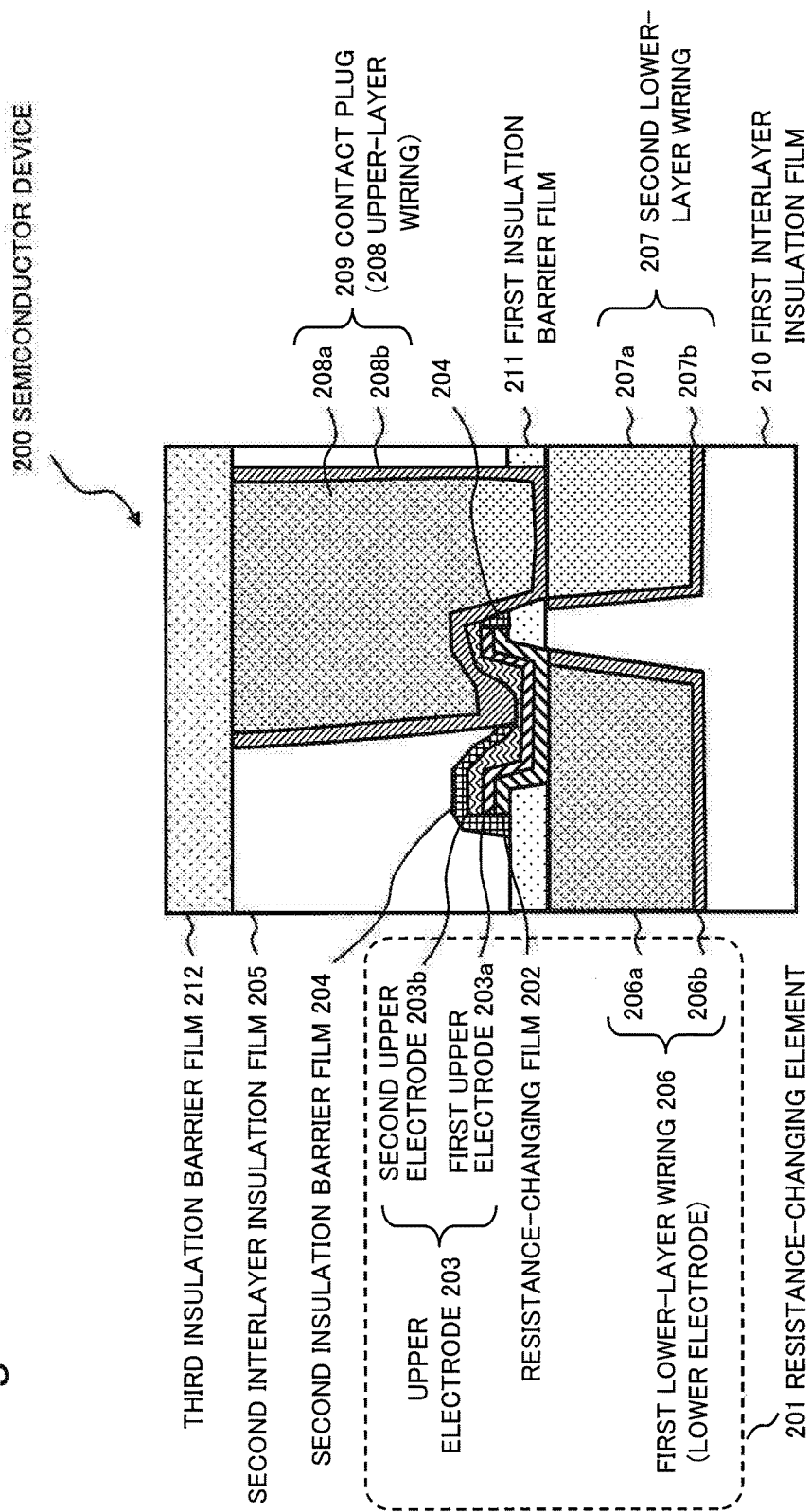
FIG. 2 is a cross-sectional schematic view illustrating a configuration of a semiconductor device of a second exemplary embodiment of the present invention.

FIG. 2 is a cross-sectional schematic view illustrating a configuration of a semiconductor device of a second exemplary embodiment of the present invention. A semiconductor device 200 of this exemplary embodiment has a resistance-changing element 201 formed in a wiring layer above a semiconductor substrate such as a silicon substrate. The semiconductor substrate may include an element such as a transistor formed thereon. The semiconductor substrate has a first interlayer insulation film 210 thereon. A first lower wiring 206 and a second lower wiring 207 are formed in the first interlayer insulation film 210. The resistance-changing element 201 has a first lower-layer wiring 206 also used as a lower electrode, a resistance-changing film 202, and an upper electrode 203 having a first upper electrode 203a and a second upper electrode 203b.

The first lower-layer wiring 206 has a copper layer 206a and a barrier metal 206b. The barrier metal 206b to be used may be Ta, TaN, or a stacked structure thereof. The upper surface of the first lower-layer wiring 206 has a first insulation barrier film 211 thereon. The first insulation barrier film 211 has an opening portion, through which the first lower-layer wiring 206 and the resistance-changing film 202 are connected to each other.

The second lower-layer wiring 207 has a copper layer 207a and a barrier metal 207b. The barrier metal 207b to be used may be Ta, TaN, or a stacked structure thereof. The upper surface of the second lower-layer wiring 207 has a first insulation barrier film 211 thereon. The first insulation barrier film 211 has an opening portion, through which the second lower-layer wiring 207 and a contact plug 209 are connected to each other.

A portion of the side and upper surfaces of the resistance-changing element 201 is covered by a second insulation barrier film 204. At least a portion of the side surface of the resistance-changing element 201 is opposed to the contact plug 209 across the second insulation barrier film 204.

The contact plug 209 is connected to the upper-layer wiring 208. Although in FIG. 2, the contact plug structure is supposed to be a slit type in which the contact plug 209 is integrated with the upper-layer wiring 208, it may be a structure in which each of them are independently formed and then connected to each other. The contact plug 209 is formed in the second interlayer insulation film 205 and has a copper layer 208a and a barrier metal 208b. The barrier metal 208b to be used may be Ta, TaN, or a stacked structure thereof. The contact plug 209 is connected to the second lower-layer wiring 207 and also to the upper and side surfaces of the second upper electrode 203b. The side surface of the first upper electrode 203a and contact plug 209 are adjacent to each other, with the second insulation barrier film 204 interposed therebetween.

When the resistance-changing element 201 is a resistance-changing element based on a deposited copper filament exploiting a solid electrolyte as a resistance-changing film 202, the first interlayer insulation film 210 to be used may be a $SiO_2$ film, a SiOC film, or a stacked-layer film thereof. The resistance-changing film 202 to be used, which is a solid electrolyte, may be TaO, TaSiO, $SiO_2$, $ZrO_2$, $HfO_2$, TiO, $Al_2O_3$, an organic polymer film, an organic polymer film containing SiO, and so on. The first upper electrode 203a is an electrode containing a metal which has an absolute value of free energy for oxidation smaller than that of copper, and Ru among others can be used therefor. The second upper electrode 203b to be used may be Ta, Ti, a nitrogen compound thereof, and so on.

A SiN film can be used for the second insulation barrier film 204. This can prevent the first upper electrode 203a from oxidation when the second interlayer insulation film 205 is formed. Further, this can inhibit the generation of a failure owing to the variation of the resistance state of the resistance-changing element 201 caused by water ingressing the resistance-changing film 202 which is a solid electrolyte.

A selected formation method of the SiN film is preferably a film deposition method which does not deteriorate the resistance-changing property of the resistance-changing element 201. For example, the plasma CVD (Chemical Vapor Deposition) method and the plasma ALD (Atomic Layer Deposition) method can be used. Further, it is preferable to form the film by taking into account a property, such as sidewall-coverage and insulation, of the film, and more preferably, a method is preferably used such as the PEALD (Plasma Enhanced ALD) method which achieves a side-coverage larger than or equal to 70%. The film thickness is preferably 10 nm or more and 50 nm or less.

The upper surface of the second interlayer insulation film 205 and the upper-layer wiring 208 have a third insulation barrier film 212 thereon. An opening portion provided in the third insulation barrier film 212 enables connection of the upper-layer wiring 208 to a still upper wiring.

The second insulation barrier film 204 provided on the side surfaces of the resistance-changing element 201 and of the first upper electrode 203a described above enables prevention of the side surface of the first upper electrode 203a from oxidation when the contact plug 209 adjacent to the resistance-changing element 201 is formed. This makes possible to dispose the resistance-changing elements 201 highly densely to actualize large capacity while keeping high the manufacturing yield and reliability of the resistance-changing elements 201.

Figure 3:
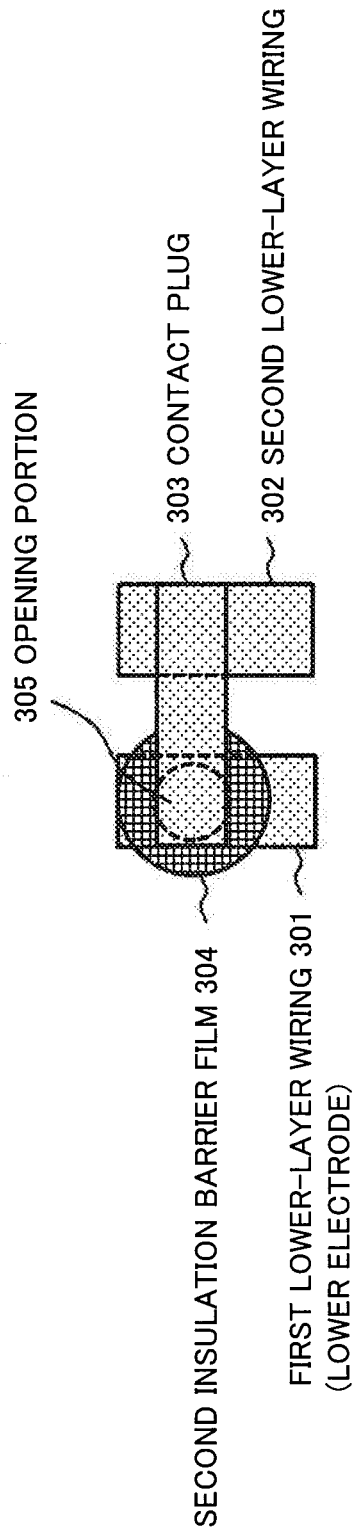
FIG. 3 is a top schematic view illustrating the configuration of the semiconductor device of the second exemplary embodiment of the present invention.

FIG. 3 is a top schematic view illustrating a configuration of a semiconductor device of this exemplary embodiment. An opening portion 305 is formed in a first lower-layer wiring 301 also used as a lower electrode. A resistance-changing layer and an upper electrode are formed on the opening by dry-etching, and a second insulation barrier film 304 is further formed thereon. The upper electrode is connected, in a portion where the second insulation barrier film 304 was removed, to a contact plug 303 integrated with an upper-layer wiring. Further, the contact plug 303 is connected to a second lower-layer wiring 302.

The connection of the second upper electrode (203b in FIG. 2) and the second lower-layer wiring 302 by using the contact plug 303 of a slit type integrated with the upper-layer wiring enables halving the connection resistance thereacross. Further, the layout as illustrated in FIG. 3 enables miniaturization of the element. The reason is that the first lower-layer wiring 301 and the second lower-layer wiring 302 can be compactly connected by the contact plug 303.

Further, when the upper electrode (203b in FIG. 2) of the resistance-changing element is directly connected to a transistor on a silicon substrate, connection can be made from the second lower-layer wiring 302 to the lower layer via the contact plug 303. Accordingly, the chip area can be shrunk. An electric current operating the resistance-changing layer can be made flow from the first lower-layer wiring 301 to the second lower-layer wiring 302 via the contact plug 303 and vice versa.

As described above, according to this exemplary embodiment, a semiconductor device is actualized with which resistance-changing elements can be disposed highly densely while keeping the manufacturing yield and reliability of the resistance-changing elements.

Third Exemplary Embodiment

Figure 4:
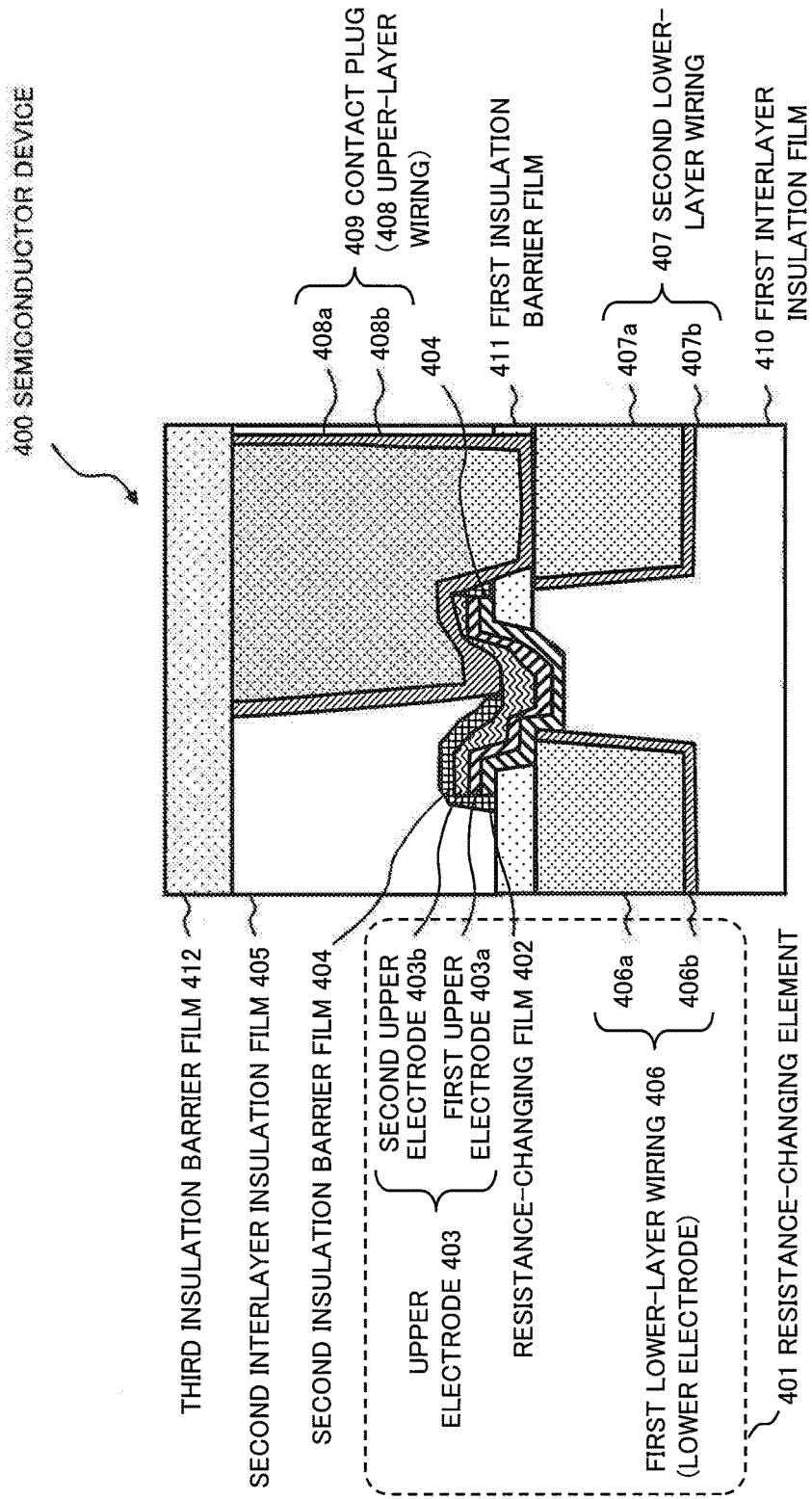
FIG. 4 is a cross-sectional schematic view illustrating a configuration of a semiconductor device of a third exemplary embodiment of the present invention.

FIG. 4 is a cross-sectional schematic view illustrating a configuration of a semiconductor device of a third exemplary embodiment of the present invention. A semiconductor device 400 of this exemplary embodiment is characterized in that an opening portion provided in a first insulation barrier film 411 is opened across a first lower-layer wiring 406 also used as a lower electrode and a first interlayer insulation film 410. Since other structures are the same as those of the semiconductor device 200 of the second exemplary embodiment, detailed explanations will be omitted.

In other words, a copper layer 406a and a barrier metal 406b which configure a first lower-layer wiring 406 also used as a lower electrode of a resistance-changing element 401, a copper layer 407a and a barrier metal 407b which configure a second lower-layer wiring 407, a resistance-changing film 402, a first upper electrode 403a and a second upper electrode 403b which configure an upper electrode 403, a second insulation barrier film 404, a second interlayer insulation film 405, a copper layer 408a and a barrier metal 408b which configure a contact plug 409 integrated with an upper-layer wiring 408, and a third insulation barrier film 412 are the same as the respective portions corresponding thereto, of the semiconductor device 200.

According to the structure of the semiconductor device 400 of this exemplary embodiment, the resistance-changing film 402 is connected to an edge portion of the first lower-layer wiring 406 also used as a lower electrode. This enables lowering the programming voltage for the resistance-changing element 401 owing to an effect of electric field concentration to the edge portion.

Figure 5:
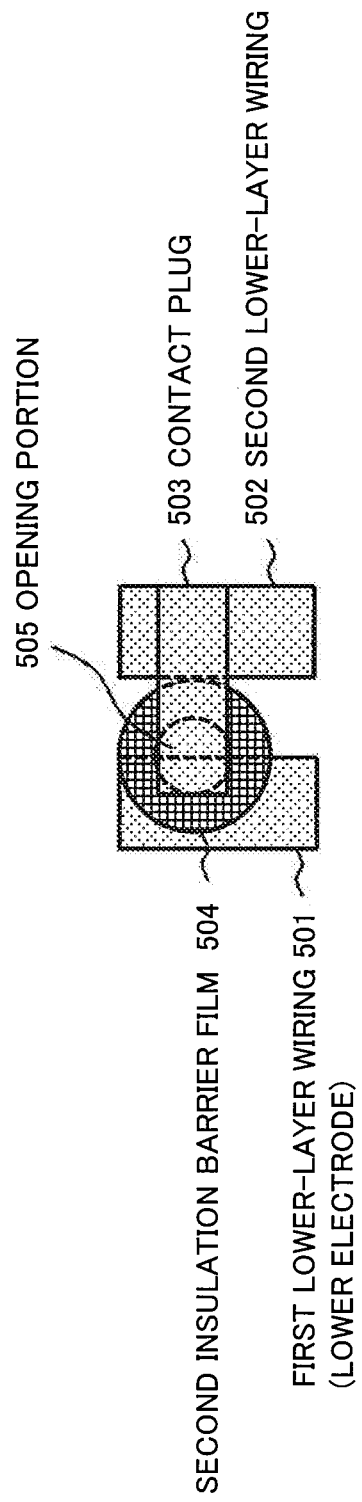
FIG. 5 is a top schematic view illustrating the configuration of the semiconductor device of the third exemplary embodiment of the present invention.

FIG. 5 is a top schematic view illustrating a configuration of the semiconductor device of this exemplary embodiment. An opening portion 505 is formed in a first lower-layer wiring 501 also used as a lower electrode. On the opening portion 505, a resistance-changing layer and an upper electrode are formed by dry-etching, followed by further formation of a second insulation barrier film 504. The upper electrode is connected, in a portion where the second insulation barrier film 504 was removed, to a contact plug 503 integrated with an upper-layer wiring. Further, the contact plug 503 is also directly connected to a second lower-layer wiring 502.

The connection of the second upper electrode (403b in FIG. 4) and the second lower-layer wiring 502 by using the contact plug 503 integrated with the upper-layer wiring enables halving the connection resistance thereacross. Further, the layout as illustrated in FIG. 5 enables miniaturization of the element. The reason is that the first lower-layer wiring 501 and the second lower-layer wiring 502 can be compactly connected by the contact plug 503.

Further, when the upper electrode of the resistance-changing element (403b in FIG. 4) is directly connected to a transistor on a silicon substrate, connection can be made from the second lower-layer wiring 502 to the lower layer via the contact plug 503. Accordingly, the chip area can be shrunk. This exemplary embodiment can further miniaturize the element and reduce the chip area in comparison to second exemplary embodiment.

Figure 9:
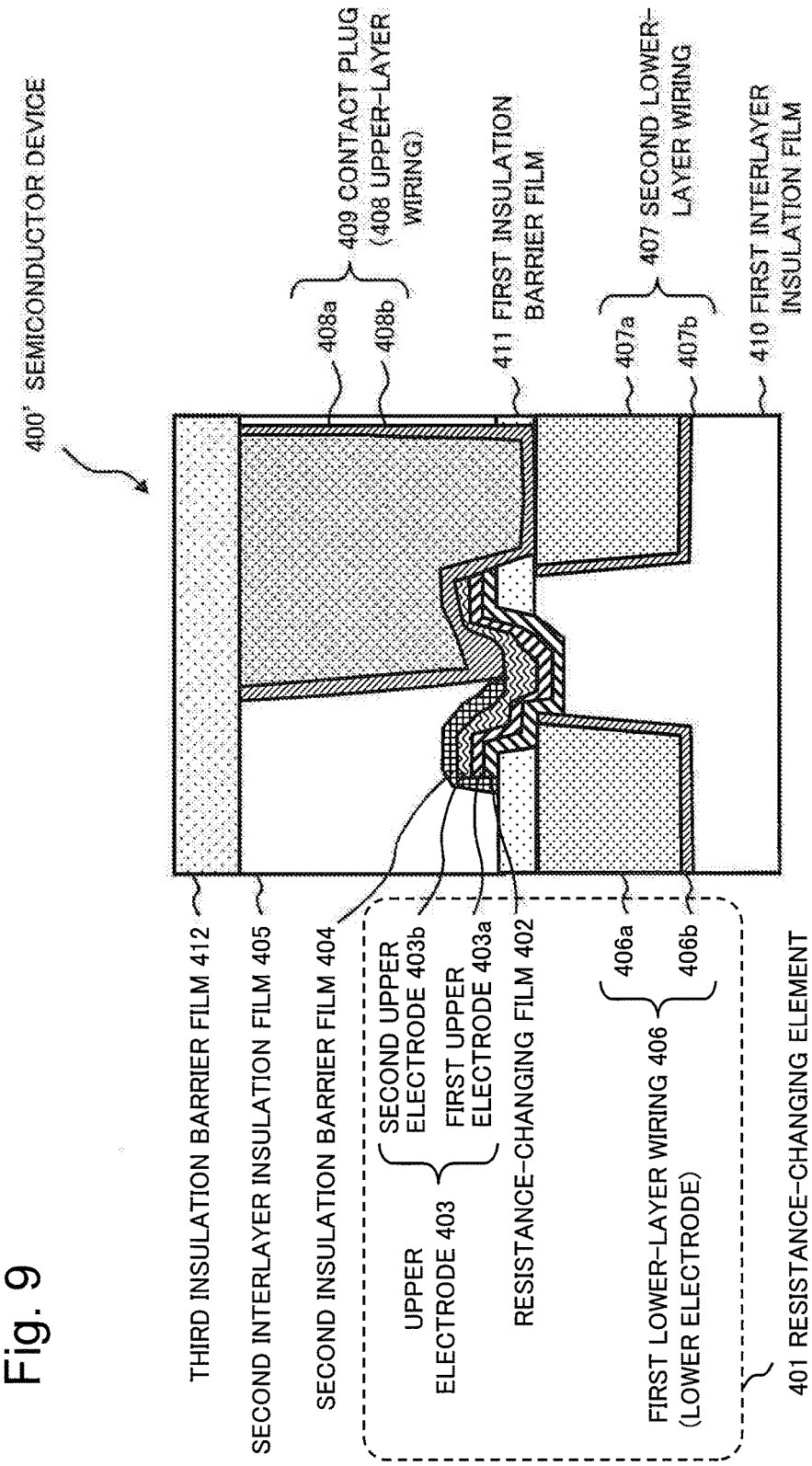
FIG. 9 is a cross-sectional schematic view illustrating a configuration of a semiconductor device of a variant example of the third exemplary embodiment of the present invention.

FIG. 9 is a cross-sectional schematic view illustrating a configuration of a semiconductor device of a variant exemplary embodiment of the present invention. The semiconductor device 400' of the variant example is different from the semiconductor device 400 in that the second insulation barrier film is absent between the side surfaces of the resistance-changing film 402 and of the upper electrode 403 and the side surface of the contact plug 409. Since other structures of the semiconductor device 400' are the same as those of the semiconductor device 400, detailed explanations will be omitted. This structure is actualized because the lower electrode 406 and the upper electrode 403 are physically separated from each other by the first insulation barrier film 411. Accordingly, even in a case that contact plug 409 and the resistance-changing film 402 are in contact to each other on the side surface of the contact plug 409 owing to the absence of the second insulation barrier film on the side surface, no short circuit occurs between the upper electrode 403 and the lower electrode 406.

As described above, according to this exemplary embodiment, a semiconductor device can be actualized with which the resistance-changing elements can be disposed highly densely while keeping the manufacturing yield and reliability of the resistance-changing elements.

Fourth Exemplary Embodiment

Figure 6:
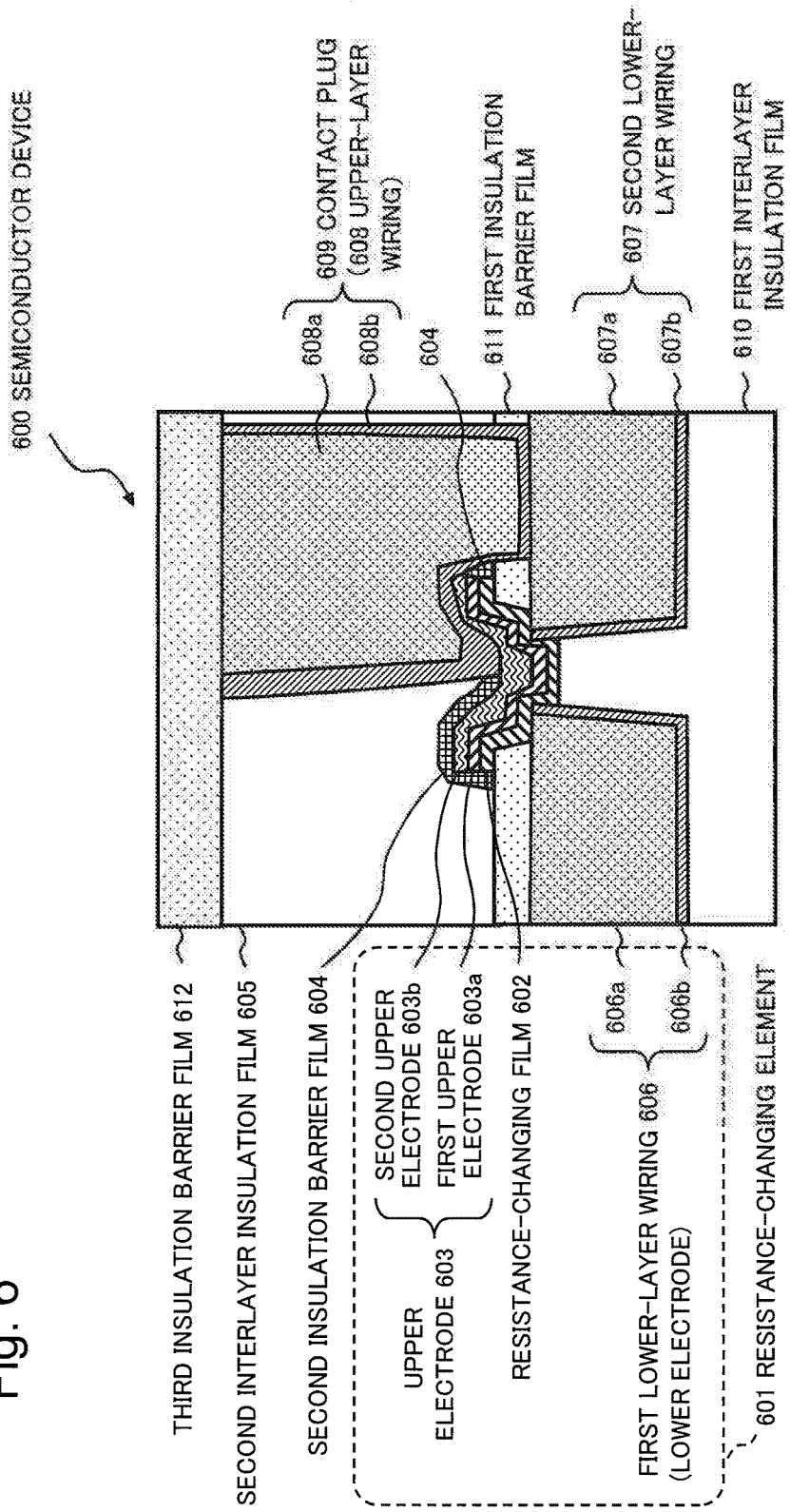
FIG. 6 is a cross-sectional schematic view illustrating a configuration of a semiconductor device of a fourth exemplary embodiment of the present invention.

FIG. 6 is a cross-sectional schematic view illustrating a configuration of a semiconductor device of a fourth exemplary embodiment of the present invention. A semiconductor device 600 of this exemplary embodiment is characterized in that an opening portion provided in a first insulation barrier film 611 is opened across a first lower-layer wiring 606 also used as a lower electrode, a first interlayer insulation film 610, and a second lower-layer wiring 607. Since other structures are the same as those of the semiconductor device 200 of the second exemplary embodiment, detailed explanations will be omitted.

In other words, a copper layer 606a and a barrier metal 606b which configure a first lower-layer wiring 606 also used as a lower electrode of a resistance-changing element 601, a copper layer 607a and a barrier metal 607b which configure a second lower-layer wiring 607, a resistance-changing film 602, a first upper electrode 603a and a second upper electrode 603b which configure an upper electrode 603, a second insulation barrier film 604, a second interlayer insulation film 605, a copper layer 608a and a barrier metal 608b which configure a contact plug 609 integrated with an upper-layer wiring 608, and a third insulation barrier film 612 are the same as the respective portions corresponding thereto, of the semiconductor device 200.

Figure 7:
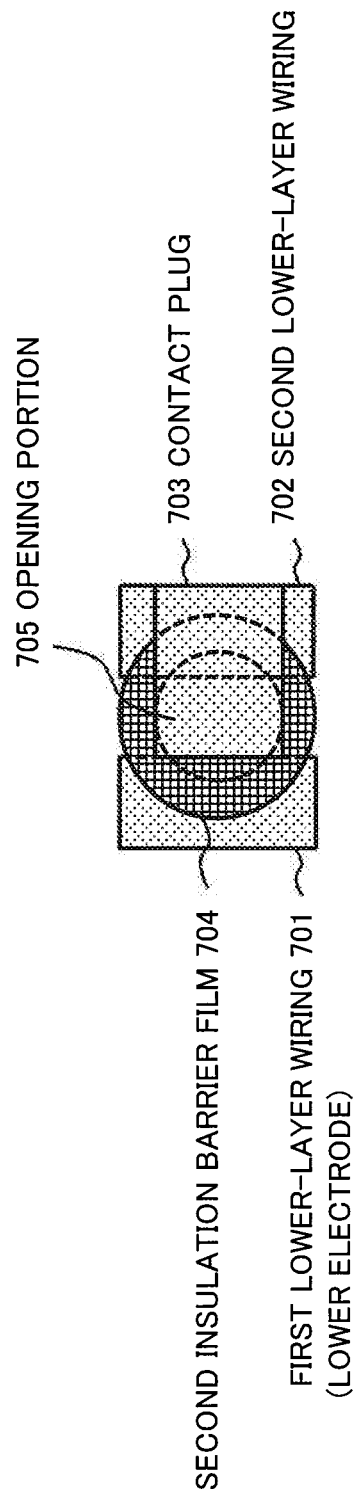
FIG. 7 is a top schematic view illustrating the configuration of the semiconductor device of the fourth exemplary embodiment of the present invention.

FIG. 7 is a top schematic view illustrating the semiconductor device of the present exemplary embodiment. An opening portion 705 is formed across a first lower-layer wiring 701 also used as a lower electrode and a second lower-layer wiring 702. On the opening portion 705, a resistance-changing layer and an upper electrode are formed by dry-etching, followed by further formation of a second insulation barrier film 704. The upper electrode is connected, in a portion where the second insulation barrier film 704 was removed, to a contact plug 703 integrated with an upper-layer wiring. Further, the contact plug 703 is also directly connected to the second lower-layer wiring 702.

The layout as illustrated in FIG. 7 enables miniaturization of the element while keeping large the connection area of the upper electrode (603b in FIG. 6) to the contact plug 703. Accordingly, in this exemplary embodiment, a smaller connection resistance between the upper electrode and the contact plug 703 can be achieved in comparison to the second and third exemplary embodiments, facilitating miniaturization of the element and shrinkage of the chip area.

Figure 8A:
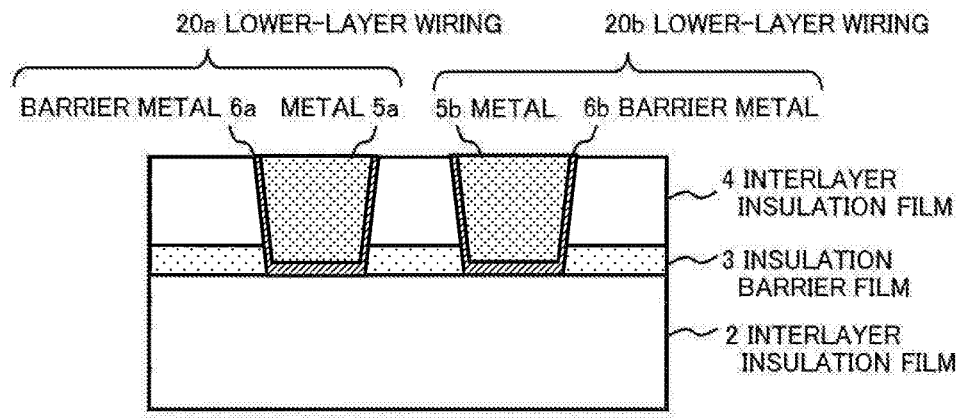
FIG. 8A illustrates a manufacturing process of the semiconductor device of the fourth exemplary embodiment of the present invention.
Figure 8B:
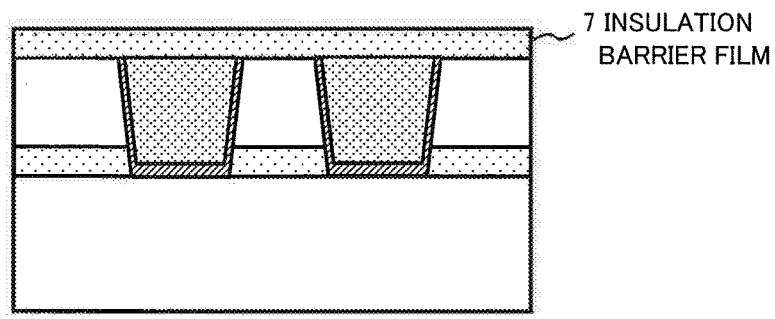
FIG. 8B illustrates the manufacturing process of the semiconductor device of the fourth exemplary embodiment of the present invention.
Figure 8C:
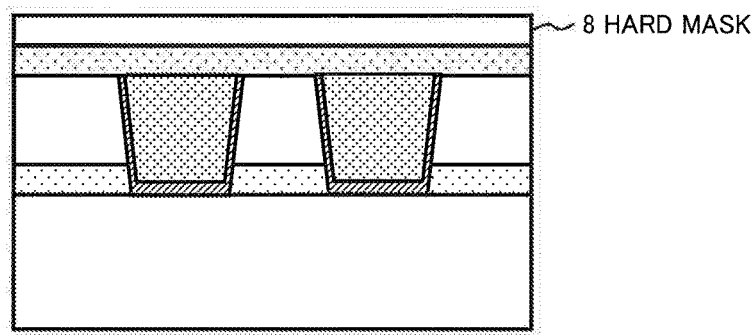
FIG. 8C illustrates the manufacturing process of the semiconductor device of the fourth exemplary embodiment of the present invention.
Figure 8D:
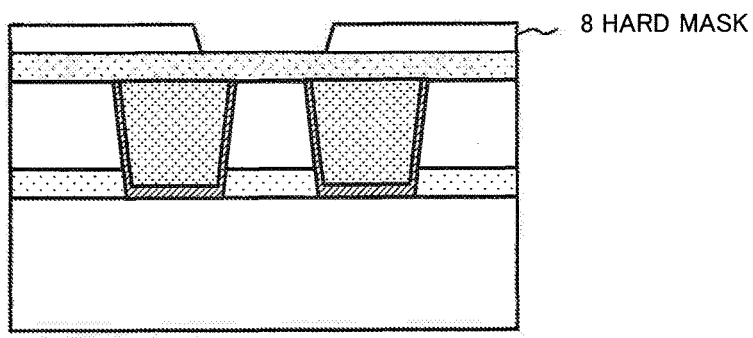
FIG. 8D illustrates the manufacturing process of the semiconductor device of the fourth exemplary embodiment of the present invention.
Figure 8E:
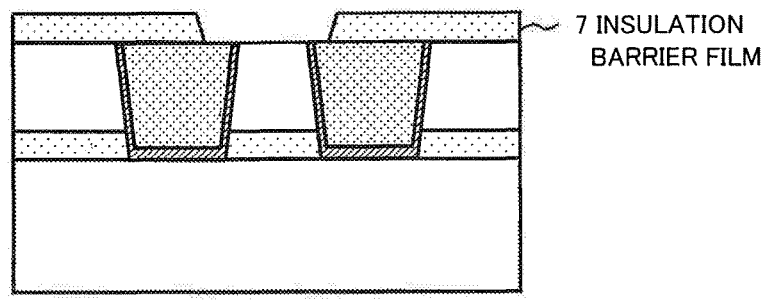
FIG. 8E illustrates the manufacturing process of the semiconductor device of the fourth exemplary embodiment of the present invention.
Figure 8F:
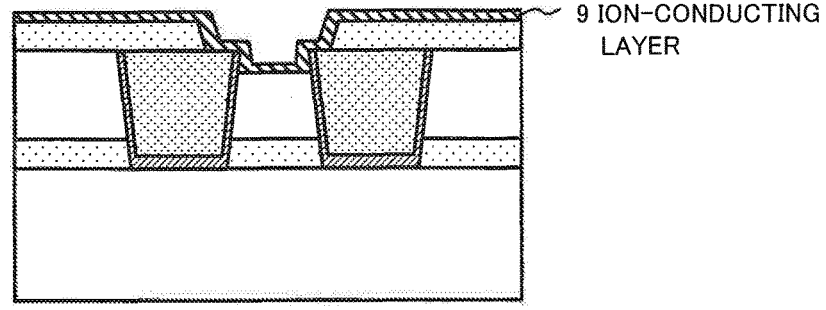
FIG. 8F illustrates the manufacturing process of the semiconductor device of the fourth exemplary embodiment of the present invention.
Figure 8G:
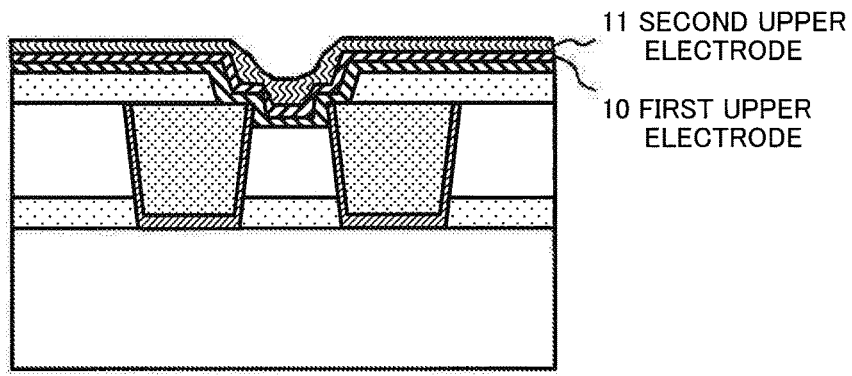
FIG. 8G illustrates the manufacturing process of the semiconductor device of the fourth exemplary embodiment of the present invention.
Figure 8H:
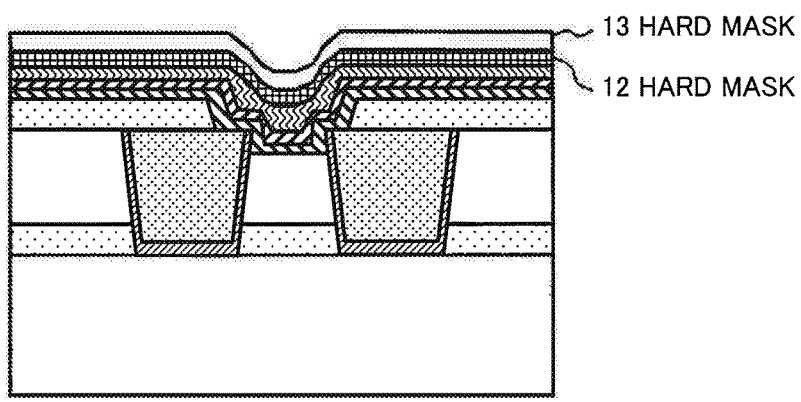
FIG. 8H illustrates the manufacturing process of the semiconductor device of the fourth exemplary embodiment of the present invention.
Figure 8I:
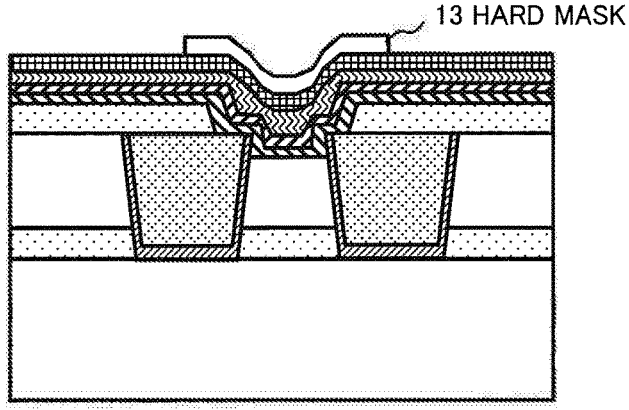
FIG. 8I illustrates the manufacturing process of the semiconductor device of the fourth exemplary embodiment of the present invention.
Figure 8J:
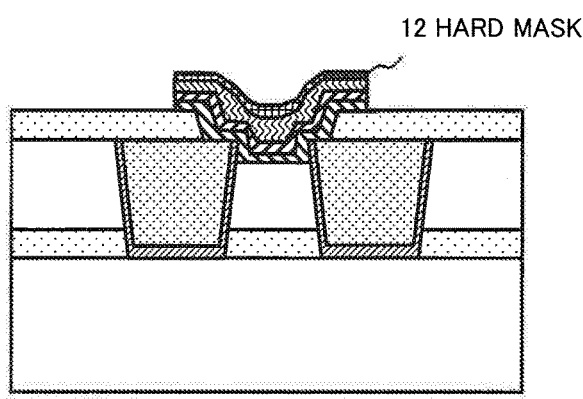
FIG. 8J illustrates the manufacturing process of the semiconductor device of the fourth exemplary embodiment of the present invention.
Figure 8K:
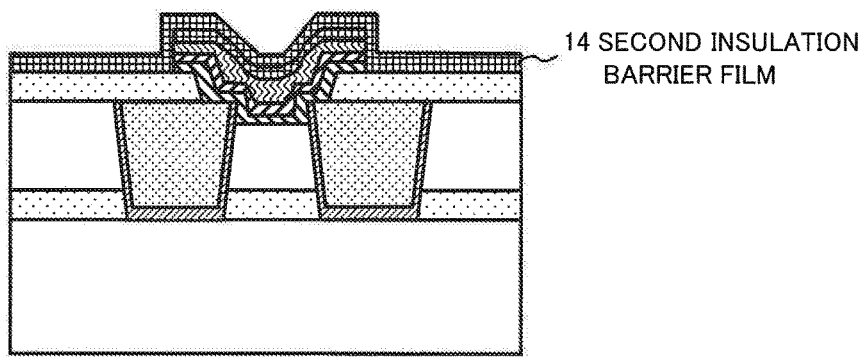
FIG. 8K illustrates the manufacturing process of the semiconductor device of the fourth exemplary embodiment of the present invention.
Figure 8L:
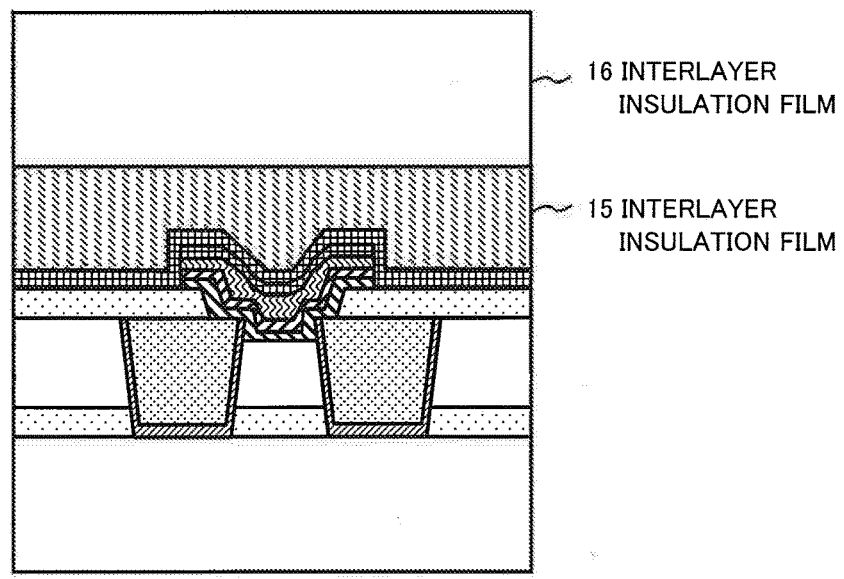
FIG. 8L illustrates the manufacturing process of the semiconductor device of the fourth exemplary embodiment of the present invention.
Figure 8M:
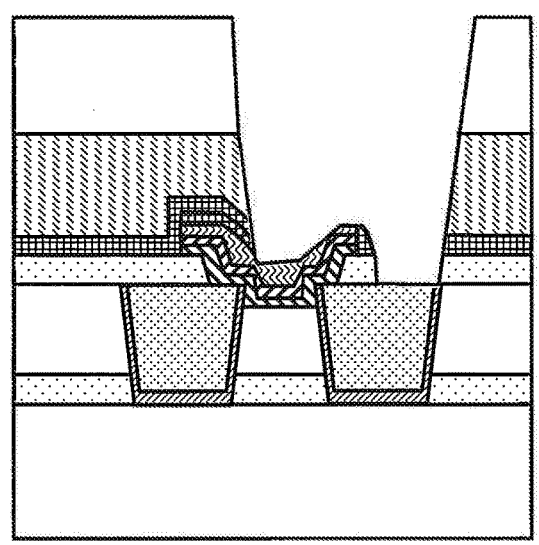
FIG. 8M illustrates the manufacturing process of the semiconductor device of the fourth exemplary embodiment of the present invention.
Figure 8N:
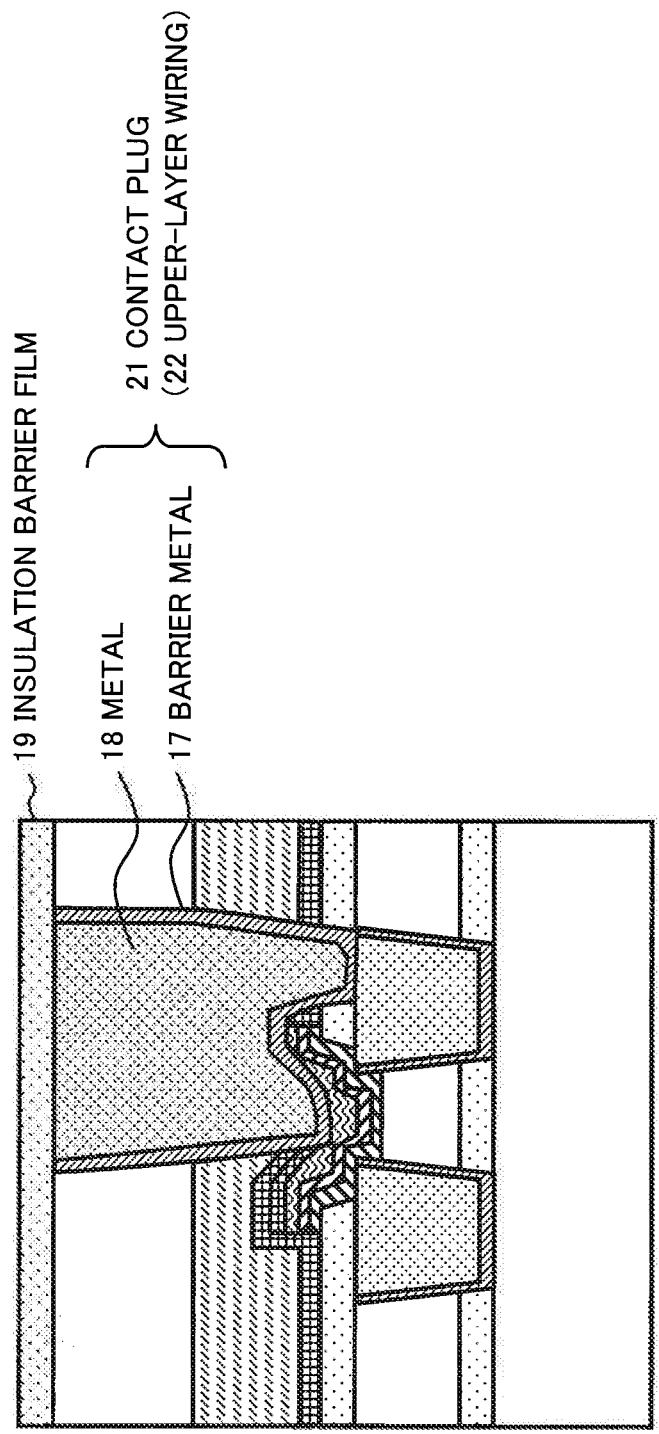
FIG. 8N illustrates the manufacturing process of the semiconductor device of the fourth exemplary embodiment of the present invention.

Next, a method for manufacturing the structure of the semiconductor device 600 of this exemplary embodiment will be specifically explained. FIGS. 8A to 8N are cross-sectional views schematically illustrating the manufacturing process of the semiconductor device 600.

(FIG. 8A) First, an interlayer insulation film 2, an insulation barrier film 3, and an interlayer insulation film 4 are successively formed on a semiconductor substrate. The semiconductor substrate herein may be a semiconductor substrate itself such as silicon wafer, or a substrate including a semiconductor element such as a transistor formed on the surface thereof. For example, the interlayer insulation film 2, the insulation barrier film 3 and the interlayer insulation film 4 may be a silicon oxide film of 300 nm in film thickness, a SiCN film of 30 nm in film thickness, and a SiOC film of 200 nm in film thickness, respectively.

Then, a wiring trench is formed in the interlayer insulation film 4 and the insulation barrier film 3 by using lithography. First, in the lithography, a photoresist forming treatment is carried out which forms pre-determined photoresist patterns on the interlayer insulation film 4. Next, a dry-etching treatment is carried out which etches anisotropically the stacked films by using photoresist as a mask, and a removal treatment is carried out which removes the resist after forming the wiring trench by dry-etching.

Then, metals 5a, 5b are filled into the wiring trench covered by barrier metals 6a, 6b, to form lower-layer wirings 20a, 20b. The barrier metals 6a, 6b are, for example, stacked-layer films of TaN (of 5 nm in film thickness)/Ta (of 5 nm in film thickness). The material of the metals 5a, 5b is, for example, copper.

(FIG. 8B) Then, the surfaces of the lower-layer wirings 20a, 20b are polished, to form an insulation barrier film 7 on the interlayer insulation film 4 including the lower-layer wirings 20a, 20b. The insulation barrier film 7 is, for example, a SiCN film of 30 nm in film thickness.

(FIG. 8C) A $SiO_2$ film of 40 nm as a hard mask 8 for dry-etching is formed on the insulation barrier film 7.

(FIG. 8D) Then, an opening portion is formed in the $SiO_2$ film which is a hard mask 8, in order to form an opening portion in the SiCN film which is an insulation barrier film 7.

(FIG. 8E) Then, the SiCN film which is an insulation barrier film 7 is subjected to reactive dry-etching by using the $SiO_2$ as a mask. For example, the reactive dry-etching can be carried out under a condition of a gas flow rate of $CF_4/Ar=25:50$ sccm, a pressure of 0.53 [Pa], a source power of 400 W, and a substrate-bias power of 90 W. A lowered source power or an increased substrate bias improves ionic property during etching, enabling decrease in the tapered angle of the SiCN film. In this case, etching corresponding to 35 nm in film thickness can be carried out for 30 nm of the insulation barrier film 7 at the bottom of the opening portion in the insulation barrier film 7.

Then, the substrate may be heated to 350° C. under a reduced-pressure atmosphere, in order to keep clean the copper surface of the lower-layer wirings 20a, 20b exposed at the bottom of the opening portion. When etch back of the copper surface is carried out by using a sputtering apparatus, the heating can be carried out in a heat chamber mounted on the sputtering apparatus.

Alternatively, when the cleaning of the copper surface is carried out by etch back by using RF etching with a non-reactive gas, it can be carried out using Ar gas under a condition of an Ar gas flow rate=30 sccm, a pressure of 1.3 [Pa], a source power of 290 W, and a substrate-bias power of 130 W. The duration of the RF etching can be quantified by using an etched quantity of the $SiO_2$ film formed by the plasma CVD method, and it is determined to be 2 nm in terms of $SiO_2$ film thickness.

(FIG. 8F) Then, an ion-conducting layer 9 is formed on the insulation barrier film 7 including the lower-layer wirings 20a, 20b. The formation of the ion-conducting layer 9 is as follows. First, a metal Zr film of 1 nm in film thickness is deposited by the DC sputtering method. Then, a porous polymer film of 5 nm in film thickness, as a solid electrolyte, is deposited on the metal Zr film by the RF plasma CVD method by using, for example, an organic monomer as a raw material. In this case, the metal Zr film is oxidized to become an oxidized zircon film by oxygen plasma generated by the degradation of the raw material during the formation of the porous polymer film. Thus, copper of the lower-layer wirings 20a, 20b can be prevented from oxidation.

In the plasma CVD method depositing the porous polymer film, the deposition can be carried out under a condition of an RF power of 50 to 300 W, a substrate temperature of 350° C., a gas mixed with He, and a pressure of 1.0 to 6.0 [Torr].

Specifically, in a plasma CVD reactor for 12 inch size, the film can be formed under a condition of a He gas flow rate=500 sccm, a pressure of 400 [Pa], and an RF power of 80 W. Under this condition, the film thickness of the oxidized zircon with respect to the film thickness of the metal Zr was confirmed by cross-sectional TEM (Transmission Electron Microscope) observation. When metal Zr of 1 nm in film thickness was deposited, the oxidized zircon of 2.0 nm in film thickness was confirmed to have been formed. Further, when the oxidizing power of oxygen plasma is intense owing to a specification of the apparatus, a thicker metal Zr film can prevent, from oxidation, the lower-layer wirings 20a, 20b also used as a lower electrode.

The Zr film has not necessarily to be formed on the insulation barrier film 7, and it may be replaced with a Ti film, an Al film, a Hf film, and so on. Alternatively, the RF power may be decreased or the flow rate of the raw material may be increased. Thus, the decomposition of the raw material is inhibited, leading to inhibited generation of oxygen plasma, thereby resulting in inhibited oxidation of the lower-layer wirings 20a, 20b.

(FIG. 8G) Then, a first upper electrode 10 and a second upper electrode 11 are successively formed on the ion-conducting layer 9. The first upper electrode 10 is, for example, Ru of 10 nm in film thickness. The second upper electrode 11 is, for example, Ta of 25 nm in film thickness.

The first upper electrode 10 can be deposited by DC sputtering using Ru as a target under a condition of a DC power of 0.2 kW and an Ar gas pressure of 0.27 [Pa]. The second upper electrode 11 can be also deposited by DC sputtering using Ta as a target under the same condition. Since both the first and second upper electrodes 10, 11 are also deposited under a reduced pressure, they are deposited at room temperature in order to inhibit escape of oxygen from the ion-conducting layer 9.

(FIG. 8H) Then, a hard mask film 12 and a hard mask film 13 are successively stacked on the second upper electrode 11. The hard mask film 12 is, for example, a SiCN film of 30 nm in film thickness. The hard mask film 13 is, for example, a $SiO_2$ film of 100 nm in film thickness.

The hard mask films 12, 13 can be deposited by using the plasma CVD method. The hard mask films 12, 13 can be formed by using the plasma CVD method which is common in the technical field. Growth temperature can be selected within a range from 200° C. to 400° C.

(FIG. 8I) Then, photoresist patterns are formed on the hard mask film 13, in order to pattern an ion-conducting layer 9 which is a resistance-changing element portion, and first and second electrodes 10, 11. Then, the hard mask film 13 is dry-etched by using the photoresist as a mask until the hard mask film 12 appears. Then, the photoresist is removed by ashing with oxygen plasma and removal of organics.

(FIG. 8J) Then, the hard mask film 12, the second upper electrode 11, the first upper electrode 10, and the ion-conducting layer 9 are successively dry-etched by using the hard mask film 13 as a mask.

The dry-etching using the hard mask film 13 is preferably stopped on the upper surface of or inside the hard mask film 12. In this case, since the ion-conducting layer 9 which is a solid electrolyte film is covered by the hard mask film 12, it is never exposed to oxygen plasma. In addition, since Ru of the first upper electrode 10 is also never exposed to oxygen plasma, side-etching of the first upper electrode 10 can be inhibited. The hard mask film 13 can be etched by using a general dry-etching apparatus of a parallel plate type.

The hard mask film 12, the second upper electrode 11, the first upper electrode 10, the ion-conducting layer 9, and the oxidized zircon film can be each etched by using a dry-etching apparatus of a parallel plate type. For example, the etching of the hard mask film 12 using the SiN film can be carried out under a condition of a gas flow rate of $CF_4$/Ar=25/50 sccm, a pressure of 053 [Pa], a source power of 400 W, and a substrate-bias power of 90 W.

Further, the etching of Ta of the second upper electrode 11 is carried out at a $Cl_2$ gas flow rate=50 sccm under a condition of a pressure of 0.53 [Pa], a source power of 400 W, and a substrate-bias power of 60 W. Still further, the etching of Ru of the first upper electrode 10 can be carried out at a gas flow rate of $Cl_2/O_2$=5/40 sccm under a condition of a pressure of 0.53 [Pa], a source power of 900 W, and a substrate-bias power of 100 W.

Still further, the etching of the solid electrolyte ion-conducting layer 9 can be carried out under a condition of a gas flow rate of $Cl_2/CF_4$/Ar=45/15/15 sccm, a pressure of 1.3 [Pa], a source power of 800 W, and a substrate-bias power of 60 W. In particular, using chlorine gas allows processing of the ion-conducting layer 9, inhibiting generation of, for example, sub-trenches, while keeping high the selectivity of SiN with respect to the lower layer. In this case, the film thickness of the insulation barrier film 7 remaining on the lower-layer wirings 20a, 20b can be adjusted so as to be within a range from 20 to 30 nm.

(FIG. 8K) Next, a second barrier insulation film 14 is deposited on the hard mask film 12, the second upper electrode 11, the first upper electrode 10, the ion-conducting layer 9, and the insulation barrier film 7. The second insulation barrier film 14 is, for example, a SiN film of 30 nm in film thickness.

The second insulation barrier film 14 can be formed from $SiH_4$ and $N_2$ as raw material gases, using RF plasma at a substrate temperature of 300° C. Since a reductive gas such as $NH_3$ and $H_2$ is not used, a water-absorbing component in the solid electrolyte film of the ion-conducting layer 9 can be eliminated in a stabilization process of the gasses for film deposition carried out just before the film deposition. In this case, the second insulation barrier film 14 is preferably a SiN film, deposited in a side-coverage of 70% or more, and preferably deposited by using, for example, the ALD method or the PEALD method.

In this case, the insulation barrier film 7, the second insulation barrier film 14, and the hard mask film 12 can be of a single material which is a SiN film. Because this protects the periphery of the resistance-changing element by the integrated SiN films, the adhesiveness of the boundaries of the films is improved, which leads to improvement in hygroscopic property, water-resistances, and oxygen-leaving resistance, resulting in improvement in the yield and reliability of the element.

(FIG. 8L) Next, an interlayer insulation film 15 is deposited on the second insulation barrier film 14 by using the plasma CVD method. The interlayer insulation film 15 is, for example, a silicon oxide film of 300 nm in film thickness. Then, the interlayer insulation film 15 is planarized by using CMP (Chemical Mechanical Polishing). In the planarization of the interlayer insulation film 15, the interlayer insulation film 15 can be polished by about 300 nm from the top surface thereof to make the remaining film thickness be about 150 nm. In this case, a colloidal silica-based or seria-based slurry can be used for polishing in the CMP of the interlayer insulation film 15.

Then, for example, a SiOC film of 150 nm in film thickness is deposited as an interlayer insulation film 16 on the interlayer insulation film 15.

(FIG. 8M) Next, a via-hole integrated with a trench for an upper-layer wiring is formed by using a via-first method which is a dual-damascene method, in order to form a contact plug in the interlayer insulation films 15, 16. First, the via-hole is formed by using photoresist by dry-etching, which is stopped on the upper surface of or inside the second insulation barrier film 14. Next, the photoresist is removed by ashing. Then, etch back of the second insulation barrier film 14 is carried out to form an opening in the second insulation barrier film 14 at the via-hole bottom, to expose simultaneously a part of the upper and side surfaces of the second upper electrode 11, and the upper surface of the lower-layer wiring 20b in the single via-hole. Dry-etching at this time can be carried out under a condition of a gas flow rate of $CF_4/Ar/O_2$=40/10/5 sccm, a pressure of 053 [Pa], a source power of 1000 W, and a substrate-bias power of 20 W.

When the first upper electrode 10 is of ruthenium, if the side surface of the ruthenium is not protected by the second insulation barrier film 14, a problem occurs in which it reacts with oxygen contained in the etching gas and forms $RuO_4$, causing side-etching. In this case, since the side surface of the first upper electrode 10 is covered by the second insulation barrier film 14, the ruthenium is never exposed to the gas for dry-etching and prevented from oxidation.

(FIG. 8N) Next, metal 18 is filled into the wiring trench covered by the barrier metal 17, to form a contact plug 21. The barrier metal 17 is, for example, TaN (of 5 nm in film thickness)/Ta (5 nm in film thickness). The material of the metal 18 is, for example, copper. Furthermore, the contact plug 21 can be formed into a form integrated with the upper-layer wiring 22.

Then, the upper-layer wiring 22 is polished, and an insulation barrier film 19 is formed on the interlayer insulation film 16 including the upper-layer wiring 22. The insulation barrier film 19 is, for example, a SiCN film of 30 nm in film thickness.

According to this exemplary embodiment, a semiconductor device can be actualized with which resistance-changing elements can be disposed highly densely while keeping the manufacturing yield and reliability of the resistance-changing elements.

In this exemplary embodiment, examples are explained which exploit a solid electrolyte or a ReRAM of an oxygen vacancy type as a resistance-changing film, but the film is not limited thereto, and other films known as resistance-changing films can also be used, such as resistance-changing films exploiting a magnetic material and resistance-changing films of a phase-changing type.

As described above, the present invention has been explained in relation to the preferable exemplary embodiments, but these exemplary embodiments are only for exemplifying the invention and do not mean to limit the invention.

Explanations for a case in which the resistance-changing element is formed in the copper wiring portion above the semiconductor substrate have been made with respect to, for example, a semiconductor device including a CMOS circuit, which is a background art of the present invention, but the present invention is not limited to the case. The present invention can be applied to a semiconductor device including a memory circuit, such as a DRAM (Dynamic RAM), an SRAM (Static RAM), a flash memory, an FRAM® (Ferro Electric RAM), an MRAM (Magnetic RAM), a resistance-changing memory, a bipolar transistor, and so on. Further the present invention can be also applied to a semiconductor device including a logic circuit, such as a micro-processor, or to a copper wiring of a board and a package which mixedly mount both of a memory circuit and a logic circuit.

Still further, the present invention can also be applied to connect an electronic circuit device, an optical circuit device, a quantum circuit device, a micro-machine, MEMS (Micro Electro Mechanical Systems), and so on to a semiconductor device. Still further, in the present invention, an exemplary embodiment for a switching function has been explained, but the present invention can be also used to, for example, a memory element exploiting both non-volatility and resistance-changing property.

The present invention can be confirmed based on a post-manufactured state of the semiconductor device. Specifically, it is confirmed, by performing a cross-sectional TEM observation of the semiconductor device, that the resistance-changing layer is mounted in the multilayered wiring layer. Further, it is confirmed, by the cross-sectional TEM observation, that the insulation film has been formed on the side surface of the resistance-changing layer or of the electrode. Still further, it is confirmed that the insulation film is not extended in a direction parallel to the substrate, and not used as an interlayer insulation film. Still further, the used material can be confirmed by a composition analysis by using not only TEM, but also EDX (Energy Dispersive X-ray Spectroscopy), EELS (Electron Energy-Loss Spectroscopy), and so on.

Specifically, it is confirmed that a functional element formed on the copper wiring is the resistance-changing film described in the exemplary embodiments of the present invention. In addition, in the case of identifying whether the second insulation barrier film is a SiN film or not, it is preferable to perform the above-mentioned composition analysis as an area analysis.

The present invention is not limited to the above described exemplary embodiments, and various modifications can be made within the scope of the invention described in Claims, which modifications are also within the scope of the invention.

In addition, some or all of the above described exemplary embodiments can be also described as, but are not limited to, the following Supplementary notes.

Supplementary Notes
(Supplementary Note 1)

A semiconductor device including an upper electrode, a first lower-layer wiring also used as a lower electrode, a resistance-changing film interposed between the upper electrode and the first lower-layer wiring, a second lower-layer wiring, and a contact plug, wherein the contact plug connects to the upper electrode and the second lower-layer wiring.

(Supplementary Note 2)

A semiconductor device according to Supplementary note 1, including an interlayer insulation film between the first lower-layer wiring and the second lower-layer wiring, and including a first insulation barrier film on the first lower-layer wiring, the second lower-layer wiring, and the interlayer insulation film, wherein the first insulation barrier film includes an opening portion on at least the first lower-layer wiring, wherein the resistance-changing film is in contact to at least the first lower-layer wiring in the opening portion.

(Supplementary Note 3)

A semiconductor device according to Supplementary note 1 or 2, wherein the side surface of the contact plug is in contact to at least a portion of both the side surface of the upper electrode and the side surface of the resistance-changing film.

(Supplementary Note 4)

A semiconductor device according to Supplementary note 1 or 2, wherein a second insulation barrier film is interposed at least partially between the side surface of the upper electrode and the contact plug.

(Supplementary Note 5)

A semiconductor device according to Supplementary note 4, wherein the second insulation barrier film includes a SiN film.

(Supplementary Note 6)

A semiconductor device according to any one of Supplementary notes 1 to 5, wherein the upper electrode includes ruthenium.

(Supplementary Note 7)

A semiconductor device according to any one of Supplementary notes 1 to 6, wherein the upper electrode includes a first upper electrode in contact to the resistance-changing film, a second upper electrode in contact to a the first upper electrode on the surface opposite to the resistance-changing film, wherein the first upper electrode includes ruthenium, wherein the second upper electrode includes tantalum, titanium, or a nitrogen compound thereof.

(Supplementary Note 8)

A semiconductor device according to Supplementary note 7, wherein the second insulation barrier film is interposed between the side surface of the first upper electrode and the contact plug.

(Supplementary Note 9)

A semiconductor device according to any one of Supplementary notes 1 to 8, wherein the contact plug is a contact plug of a slit type integrated with an upper-layer wiring.

(Supplementary Note 10)

A semiconductor device according to any one of Supplementary notes 1 to 9, wherein the contact plug includes copper having a perimeter portion covered with a barrier metal.

(Supplementary Note 11)

A semiconductor device according to any one of Supplementary notes 1 to 10, wherein the resistance-changing film includes a solid electrolyte.

(Supplementary Note 12)

A method for manufacturing a semiconductor device, including:

forming a first lower-layer wiring and a second lower-layer wiring on a first interlayer insulation film formed on a semiconductor substrate;

forming a first insulation barrier film on the first lower-layer wiring, the second lower-layer wiring, and the first interlayer insulation film, the first insulation barrier film having an opening portion through which at least the first lower-layer wiring is exposed;

forming, through the opening portion, a resistance-changing film and an upper electrode successively on at least the first lower-layer wiring;

forming a second insulation barrier film on at least side surface of the upper electrode;

forming a second interlayer insulation film on the second insulation barrier film;

forming a via-hole through the second interlayer insulation film and the second insulation barrier film, to expose the upper electrode and the second lower-layer wiring at the bottom of the via-hole; and forming, in the via-hole, a contact plug connecting the upper electrode and the second lower-layer wiring.

(Supplementary Note 13)

The method of manufacturing a semiconductor device according to Supplementary note 12, wherein the upper electrode includes ruthenium.

(Supplementary Note 14)

The method for manufacturing a semiconductor device according to Supplementary note 12 or 13, wherein the second insulation barrier film includes a SiN film.

(Supplementary Note 15)

The method for manufacturing a semiconductor device according to any one of Supplementary notes 12 to 14, wherein the second insulation barrier film is deposited in a side-coverage of 70% or more.

(Supplementary Note 16)

The method for manufacturing a semiconductor device according to any one of Supplementary notes 12 to 15, wherein the contact plug is a contact plug of a slit type integrated with the upper-layer wiring.

(Supplementary Note 17)

The method for manufacturing a semiconductor device according to any one of Supplementary notes 12 to 16, wherein the contact plug includes copper having a perimeter portion covered with a barrier metal.

(Supplementary Note 18)

The method for manufacturing a semiconductor device according to any one of Supplementary notes 12 to 17, wherein the resistance-changing film includes a solid electrolyte.

This application is based upon and claims the benefit of priority from Japanese patent application No. 2014-111109, filed on May 29, 2014, the disclosure of which is incorporated herein in its entirety by reference.

INDUSTRIAL APPLICABILITY

The present invention can be applied to a semiconductor integrated circuit, a semiconductor device, and a manufacturing method thereof.

REFERENCE SIGNS LIST 100, 200, 400, 400', 600 SEMICONDUCTOR DEVICE
201, 401, 601 RESISTANCE-CHANGING ELEMENT
102, 202, 402, 602 RESISTANCE-CHANGING FILM
101, 203, 403, 603 UPPER ELECTRODE
203a, 403a, 603a FIRST UPPER ELECTRODE
203b, 403b, 603b SECOND UPPER ELECTRODE
204, 404, 604 SECOND INSULATION BARRIER FILM
103, 206, 406, 606 FIRST LOWER-LAYER WIRING
104, 207, 407, 607 SECOND LOWER-LAYER WIRING
208, 408, 608 UPPER-LAYER WIRING
206a, 406a, 606a, 207a, 407a, 607a, 208a, 408a, 608a COPPER LAYER
206b, 406b, 606b, 207b, 407b, 607b, 208b, 408b, 608b BARRIER METAL
105, 209, 409, 609 CONTACT PLUG
205, 405, 605 SECOND INTERLAYER INSULATION FILM
210, 410, 610 FIRST INTERLAYER INSULATION FILM
211, 411, 611 FIRST INSULATION BARRIER FILM
212, 412, 612 THIRD INSULATION BARRIER FILM
301, 501, 701 FIRST LOWER-LAYER WIRING
302, 502, 702 SECOND LOWER-LAYER WIRING
303, 503, 703 CONTACT PLUG
304, 504, 704 SECOND INSULATION BARRIER FILM
305, 505, 705 OPENING PORTION
2, 4, 15, 16 INTERLAYER INSULATION FILM
3, 7, 19 INSULATION BARRIER FILM
5a, 5b, 18 METAL
6a, 6b, 17 BARRIER METAL
8, 12, 13 HARD MASK
9 ION-CONDUCTING LAYER
10 FIRST UPPER ELECTRODE
11 SECOND UPPER ELECTRODE
14 SECOND INSULATION BARRIER FILM
20a, 20b LOWER-LAYER WIRING
21 CONTACT PLUG
22 UPPER-LAYER WIRING

The invention claimed is:

1. A semiconductor device including:
an upper electrode;
a first lower-layer wiring also used as a lower electrode;
a resistance-changing film interposed between the upper electrode and the first lower-layer wiring;
a second lower-layer wiring; and
a contact plug,
wherein the contact plug connects to the upper electrode and the second lower-layer wiring,
wherein the upper electrode includes a first upper electrode in contact to the resistance-changing film, and a second upper electrode in contact to the first upper electrode on a surface opposite to the resistance-changing film, and
wherein the first upper electrode includes ruthenium, and the second upper electrode includes tantalum, titanium, or a nitrogen compound thereof.

2. A semiconductor device according to claim 1, including an interlayer insulation film between the first lower-layer wiring and the second lower-layer wiring, and
including a first insulation barrier film on the first lower-layer wiring, the second lower-layer wiring, and the interlayer insulation film,
wherein the first insulation barrier film includes an opening portion on at least the first lower-layer wiring,
wherein the resistance-changing film is in contact to at least the first lower-layer wiring in the opening portion.

3. A semiconductor device according to claim 1, wherein the side surface of the contact plug is in contact to at least a portion of both the side surface of the upper electrode and the side surface of the resistance-changing film.

4. A semiconductor device according to claim 1, wherein a second insulation barrier film is interposed at least partially between the side surface of the upper electrode and the contact plug.

5. A semiconductor device according to claim 4, wherein the second insulation barrier film includes a SiN film.

6. A semiconductor device according to claim 1, wherein the contact plug is a contact plug of a slit type integrated with an upper-layer wiring.

7. A semiconductor device according to claim 1, wherein the resistance-changing film includes a solid electrolyte.

8. A method for manufacturing a semiconductor device, including:
forming a first lower-layer wiring and a second lower-layer wiring on a first interlayer insulation film formed on a semiconductor substrate;
forming a first insulation barrier film on the first lower-layer wiring, the second lower-layer wiring, and the first interlayer insulation film, the first insulation barrier film having an opening portion through which at least the first lower-layer wiring is exposed;
forming, through the opening portion, a resistance-changing film and an upper electrode successively on at least the first lower-layer wiring;
forming a second insulation barrier film on at least side surface of the upper electrode;
forming a second interlayer insulation film on the second insulation barrier film;
forming a via-hole through the second interlayer insulation film and the second insulation barrier film, to expose the upper electrode and the second lower-layer wiring at the bottom of the via-hole; and
forming, in the via-hole, a contact plug connecting the upper electrode and the second lower-layer wiring.

9. A semiconductor device including an upper electrode, a first lower-layer wiring also used as a lower electrode, a resistance-changing film interposed between the upper electrode and the first lower-layer wiring and directly connected to the upper electrode and the first lower-layer wiring, a second lower-layer wiring, and a contact plug, wherein the contact plug directly connects to the upper electrode and the second lower-layer wiring.

10. A semiconductor device according to claim 9, including an interlayer insulation film between the first lower-layer wiring and the second lower-layer wiring, and
including a first insulation barrier film on the first lower-layer wiring, the second lower-layer wiring, and the interlayer insulation film,
wherein the first insulation barrier film includes an opening portion on at least the first lower-layer wiring,
wherein the resistance-changing film is in contact to at least the first lower-layer wiring in the opening portion.

11. A semiconductor device according to claim 9, wherein the side surface of the contact plug is in contact to at least a portion of both the side surface of the upper electrode and the side surface of the resistance-changing film.

12. A semiconductor device according to claim 9, wherein a second insulation barrier film is interposed at least partially between the side surface of the upper electrode and the contact plug.

13. A semiconductor device according to claim 12, wherein the second insulation barrier film includes a SiN film.

14. A semiconductor device according to claim 9, wherein the upper electrode includes ruthenium.

15. A semiconductor device according to claim 9, wherein the upper electrode includes a first upper electrode in contact to the resistance-changing film, a second upper electrode in contact to a the first upper electrode on the surface opposite to the resistance-changing film, wherein the first upper electrode includes ruthenium, wherein the second upper electrode includes tantalum, titanium, or a nitrogen compound thereof.

16. A semiconductor device according to claim 9, wherein the contact plug is a contact plug of a slit type integrated with an upper-layer wiring.

17. A semiconductor device according to claim 9, wherein the resistance-changing film includes a solid electrolyte.

* * * * *